(12) United States Patent
Risaki et al.

(10) Patent No.: US 8,324,687 B2
(45) Date of Patent: Dec. 4, 2012

(54) SEMICONDUCTOR DEVICE

(75) Inventors: Tomomitsu Risaki, Chiba (JP); Shoji Nakanishi, Chiba (JP); Koichi Shimazaki, Chiba (JP)

(73) Assignee: Seiko Instruments Inc., Chiba (JP)

( * ) Notice: Subject to any disclaimer, the term of this patent is extended or adjusted under 35 U.S.C. 154(b) by 266 days.

(21) Appl. No.: 12/695,443

(22) Filed: Jan. 28, 2010

(65) Prior Publication Data

US 2010/0187608 A1 Jul. 29, 2010

(30) Foreign Application Priority Data

Jan. 29, 2009 (JP) ................. 2009-018251

(51) Int. Cl.
*H01L 23/62* (2006.01)
(52) U.S. Cl. ................. 257/355; 257/591; 257/E29.005
(58) Field of Classification Search .................. 257/355, 257/591, E29.005
See application file for complete search history.

(56) References Cited

U.S. PATENT DOCUMENTS 5,907,173 A 5/1999 Kwon et al.
2004/0016992 A1 1/2004 Mallikarjunaswamy
2008/0182394 A1* 7/2008 Yang et al. ..................... 438/510
2008/0315308 A1 12/2008 Huang et al.

FOREIGN PATENT DOCUMENTS

JP 2004-335634 A 11/2004

OTHER PUBLICATIONS

Extended European Search Report for European Application No. 10151836.3, dated Oct. 7, 2011, 7 pages.

* cited by examiner

*Primary Examiner* — Tan N Tran
(74) *Attorney, Agent, or Firm* — Brinks Hofer Gilson & Lione

(57) ABSTRACT

Provided is a semiconductor device comprising: a PW layer formed at a surface of a semiconductor substrate; an NW layer formed at the surface of the semiconductor substrate to be in contact with the PW layer; a p+ base layer formed at the surface of the semiconductor substrate in the PW layer; an n+ collector layer formed at the surface of the semiconductor substrate in the NW layer; an n+ emitter layer located between the p+ base layer and the n+ collector layer and formed at the surface of the semiconductor substrate in the PW layer; and an n± layer formed between the n+ collector layer and the PW layer to be in contact with the n+ collector layer.

9 Claims, 15 Drawing Sheets

ESD Element according to Embodiment 7

ESD Element having EDMOS Structure

SEMICONDUCTOR DEVICE

RELATED APPLICATIONS

This application claims priority under 35 U.S.C. §119 to Japanese Patent Application No. 2009-018251 filed on Jan. 29, 2009, the entire content of which is hereby incorporated by reference.

BACKGROUND OF THE INVENTION

1. Field of the Invention

The present invention relates to a semiconductor device, in particular, to a semiconductor device having high electrostatic discharge (ESD) immunity.

2. Description of the Related Art

An ESD element is indispensable in maintaining reliability of an integrated circuit (IC), though it is not directly responsible for a function of the IC. The ESD element refers to an electrostatic discharge element and serves to release static electricity in order to avoid destruction of the IC by the static electricity.

Accordingly, it is an essential condition that the ESD element itself is not thermally destroyed by the static electricity and is able to protect an internal circuit by dissipating electric charges quickly before the static electricity enters the internal circuit. In order to satisfy this condition, the ESD element is required to have properties of high driving ability and suppressing local heat generation. A generally employed method is to increase a sectional area of the ESD element at a point through which current flows, resulting in inevitable increase in the size of the ESD element. It is thus important to obtain the above-mentioned properties within an ESD element of a small size.

Further, in order not to disrupt the normal function of the IC, the ESD element is required to have a breakdown voltage that is not smaller than the absolute maximum rating of the IC. Especially in a case of a high withstanding voltage IC, the above-mentioned local heat generation problem becomes more serious since the ESD protection element must dissipate electrostatic charges while being applied with a voltage that is not smaller than the absolute maximum rating.

JP 2004-335634 A discloses a structure for preventing melting and destruction of an electrode due to local heat generation of an ESD element. FIG. 2 shows a sectional view of a conceptually illustrated structure. When positive static electricity is injected, for example, to an input pad (PAD), the static electricity flows through a collector electrode 7 to an n+ collector layer 2 and into an N-well electric field relaxation layer 23 for improving withstanding voltage. However, with the N-well electric field relaxation layer 23 having high resistance, electric charges tend to accumulate in the n+ collector layer 2, and the electric field becomes strong to locally generate heat around a boundary ("heat generation area" encircled in FIG. 2) between the n+ collector layer 2 and the N-well electric field relaxation layer 23 on a path having a small distance from the n+ collector layer 2 to an n+ emitter layer 6. The generated heat is conducted to a collector contact region 1 to melt the collector electrode 7. In order to solve this problem, the prior are attempts to prevent the melting and destruction of the collector electrode 7 by extending the distance b from the above-mentioned heat generation area to the collector contact region 1.

Since the method disclosed in JP 2004-335634 A is not, however, for suppressing local heat generation itself, melting and destruction of the silicon where the heat is generated may occur. Further, extension of the distance b not only increases the size, but also increases resistance of the n+ collector layer 2 and reduces the driving ability of the ESD element itself to increase a possible risk of exposing the internal circuit to a static electricity. A long base length of the ESD element is needed to increase the driving ability, further giving an increase in the size.

As described above, in order to obtain sufficient properties without increasing the size of the ESD element, it is important to suppress the local heat generation itself in the ESD element.

SUMMARY OF THE INVENTION

In view of the above, the present invention employs the following means in order to solve the above-mentioned problem.

(1) A semiconductor device according to an aspect of the present invention includes: a semiconductor substrate; a PW layer of a first conductivity type which is formed at a surface of the semiconductor substrate and has an impurity concentration higher than an impurity concentration of the semiconductor substrate; an NW layer of a second conductivity type which is formed at the surface of the semiconductor substrate to be in contact with the PW layer and has an impurity concentration higher than the impurity concentration of the semiconductor substrate; a p+ base layer of the first conductivity type which is formed at the surface of the semiconductor substrate in the PW layer and has an impurity concentration higher than the impurity concentration of the PW layer; an n+ collector layer of the second conductivity type which is formed at the surface of the semiconductor substrate in the NW layer and has an impurity concentration higher than the impurity concentration of the NW layer; an n+ emitter layer of the second conductivity type which is located between the p+ base layer and the n+ collector layer, is formed at the surface of the semiconductor substrate in the PW layer, and has an impurity concentration higher than the impurity concentration of the PW layer; and an n± layer of the second conductivity type which is formed between the n+ collector layer and the PW layer to be in contact with the n+ collector layer and has an impurity concentration that is lower than the impurity concentration of the n+ collector layer and higher than the impurity concentration of the NW layer.

(2) In the semiconductor device according to Item (1), the n± layer is formed inside the NW layer.

(3) In the semiconductor device according to Item (1), the n± layer is formed to extend over the NW layer and the PW layer.

(4) In the semiconductor device according to Item (2), the n+ collector layer is formed inside the n± layer.

(5) In the semiconductor device according to Item (3), the n+ collector layer is formed inside the n± layer.

(6) A semiconductor device according to another aspect of the present invention includes: a semiconductor substrate; a PW layer of a first conductivity type which is formed at a surface of the semiconductor substrate and has an impurity concentration higher than an impurity concentration of the semiconductor substrate; an NW layer of a second conductivity type which is formed at the surface of the semiconductor substrate to be in contact with the PW layer and has an impurity concentration higher than the impurity concentration of the semiconductor substrate; a p+ voltage fixation layer of the first conductivity type which is formed at the surface of the semiconductor substrate in the PW layer and has an impurity concentration higher than the impurity concentration of the PW layer; an n+ drain layer of the second conductivity type which is formed at the surface of the semiconductor substrate in the NW layer and has an impurity concentration higher than the impurity concentration of the NW layer; an n+ source layer of the second conductivity type which is located between the p+ voltage fixation layer and the n+ drain layer, is formed at the surface of the semiconductor substrate in the PW layer, and has an impurity concentration higher than the impurity concentration of the PW layer; an n± layer of the second conductivity type which is formed between the n+ drain layer and the PW layer to be in contact with the n+ drain layer and has an impurity concentration that is lower than the impurity concentration of the n+ drain layer and higher than the impurity concentration of the NW layer; a gate oxide film formed on the surface of the semiconductor substrate in a portion between the n± layer and the n+ source layer; and a gate electrode formed on the gate oxide film.

(7) The semiconductor device according to Item (6) further includes: an oxide film formed on the surface of the semiconductor substrate in a portion of the n+ layer; and an electrode formed on the oxide film to be separated from the gate electrode.

(8) The semiconductor device according to Item (7) further includes an n layer of the second conductivity type at the surface of the semiconductor substrate between the gate electrode and the electrode above the n± layer.

(9) In the semiconductor device according to Item (6), the n± layer is formed inside the NW layer.

(10) In the semiconductor device according to Item (7), the n± layer is formed inside the NW layer.

(11) In the semiconductor device according to Item (8), the n± layer is formed inside the NW layer.

(12) In the semiconductor device according to Item (6), the n+ collector layer is formed inside the n+ layer.

(13) In the semiconductor device according to Item (7), the n+ collector layer is formed inside the n+ layer.

(14) In the semiconductor device according to Item (8), the n+ collector layer is formed inside the n± layer.

By employing the above-mentioned means, the locally generated heat is dispersed and the maximum heat generation temperature is reduced, to thereby enhance the ESD immunity.

DETAILED DESCRIPTION OF THE PREFERRED EMBODIMENTS

A semiconductor device according to the present invention is described below with reference to the drawings.

Embodiment 1

Figure 1:
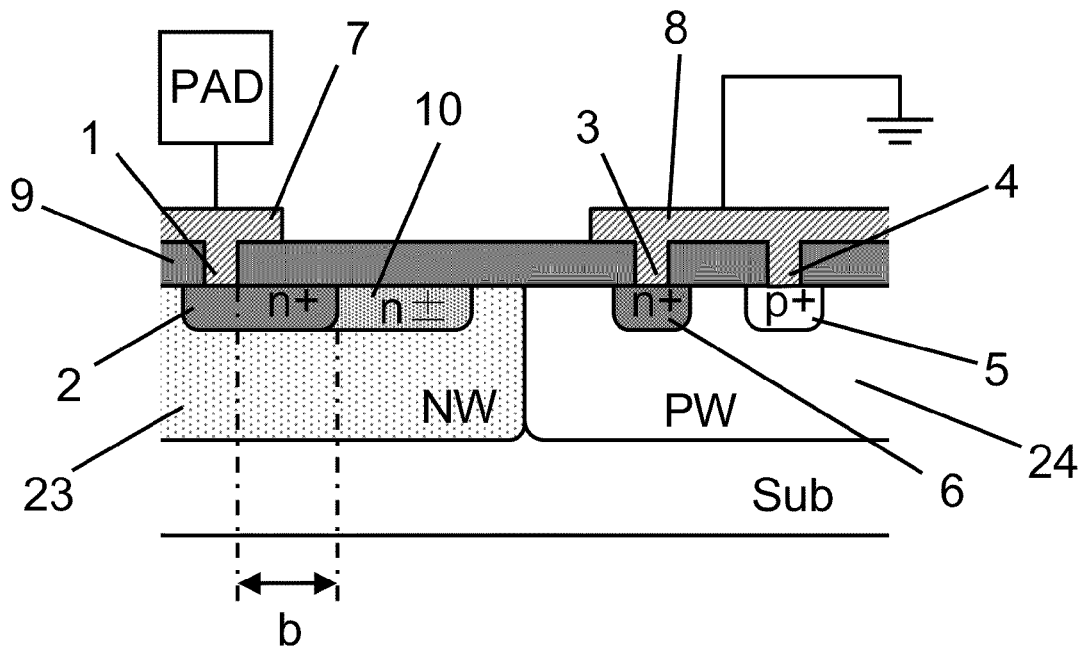
FIG. 1 is a sectional view illustrating Embodiment 1 of the present invention.

FIG. 1 is a sectional view illustrating Embodiment 1 of the present invention. At a surface of a semiconductor substrate Sub, an NW layer 23 (n-type well in this embodiment), which is an electric field relaxation layer for improving withstanding voltage having an impurity concentration higher than that of the semiconductor substrate, and a PW layer 24 (p-type well in this embodiment), which is a base region, are formed adjacent to each other. At the surface of the semiconductor substrate in the NW layer 23, an n+ collector layer 2, which has an impurity concentration higher than that of the NW layer 23, is formed, and an n± layer 10, which is an electric field relaxation layer for suppressing heat generation having an intermediate impurity concentration between the impurity concentration of the n+ collector layer 2 and the impurity concentration of the NW layer 23, is formed adjacent to the n+ collector layer 2 on a side of the n+ collector layer 2 which is nearer to the PW layer 24. At this time, one side end of the n± layer 10 is adjacent to the n+ collector layer 2, and the other side end is in contact with the NW layer 23 but is separated from a junction interface between the NW layer 23 and the PW layer 24.

Further, at the surface of the semiconductor substrate in the PW layer 24, an n+ emitter layer 6 and a p+ base layer 5 are formed to be separated from each other. Specifically, the n+ emitter layer 6 is formed to be separated from the junction interface between the NW layer 23 and the PW layer 24, and the p+ base layer 5 is formed next to the n+ emitter layer 6. The surface of the semiconductor substrate is covered with an insulating film 9. A collector contact region 1, an emitter contact region 3, and a base contact region 4 are formed on the n+ collector layer 2, the n+ emitter layer 6, and the p+ base layer 5 to extract electrodes, respectively. The n+ collector layer 2 is connected to an input pad (PAD) through a collector electrode 7. The n+ emitter layer 6 and the p+ base layer 5 are connected to ground through an emitter/base electrode 8 serving as a common wiring.

Figure 2:
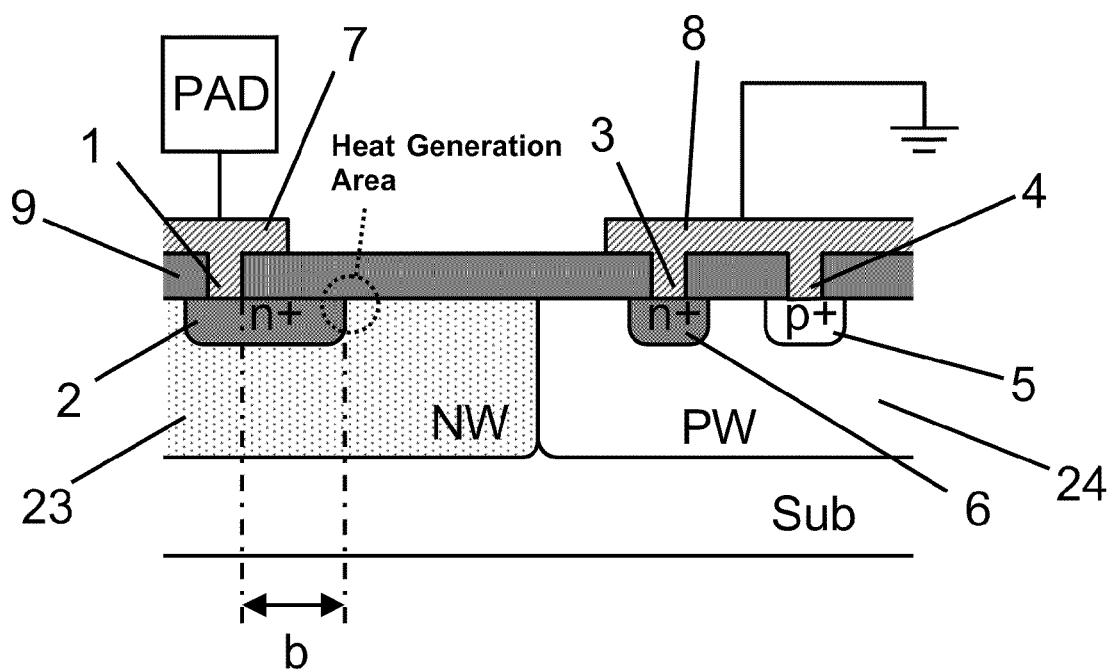
FIG. 2 is a sectional view illustrating an example of a related art.

The structure of this embodiment is obtained by inserting in the NW layer 23, which is the electric field relaxation layer for improving withstanding voltage between the n+ collector layer 2 and the n+ emitter layer 6 of the electrostatic discharge (ESD) element illustrated in FIG. 2 as an example of a related art, the n± layer 10, which is the electric field relaxation layer for suppressing heat generation having the intermediate impurity concentration between the n+ collector layer 2 and the NW layer 23. By inserting the n± layer 10 to eliminate a sharp concentration gradient, accumulation of electric charges is prevented from concentrating in a narrow area when static electricity is injected, to thereby limit the local field and suppress the local heat generation.

Figure 12B:
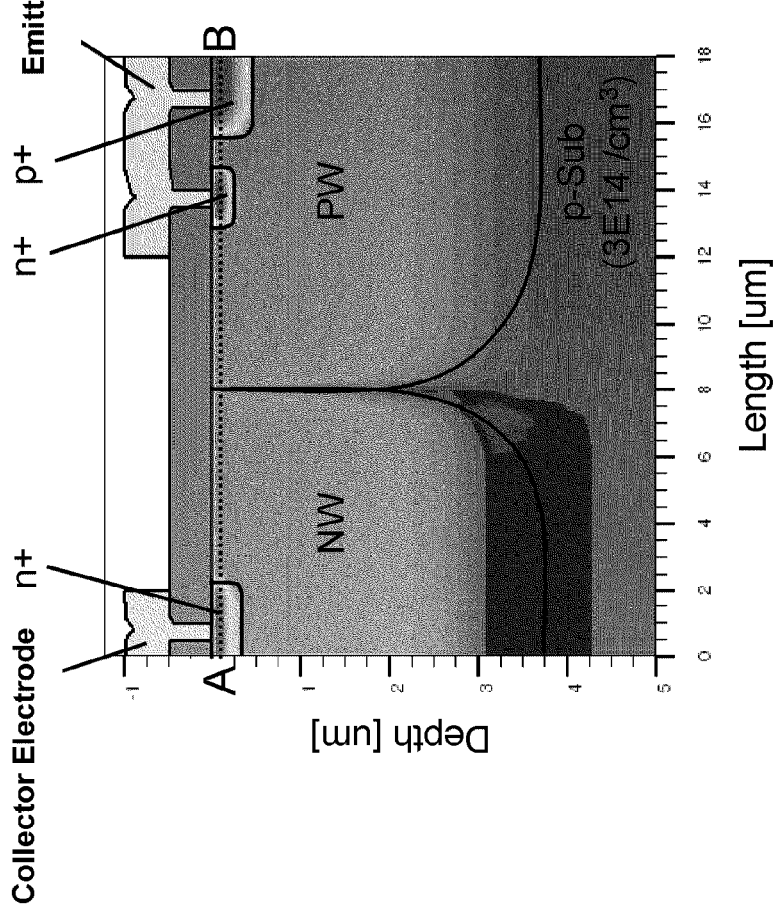
FIG. 12B is an impurity concentration distribution along a line segment AB of FIG. 12A.
Figure 12A:
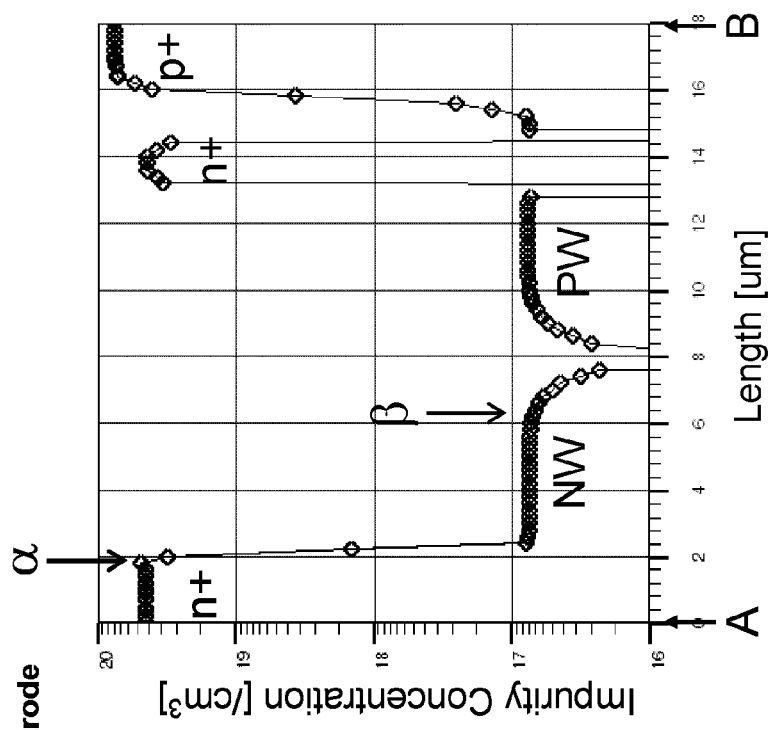
FIG. 12A is a simulated impurity concentration distribution of the ESD element illustrated in FIG. 2.
Figure 13B:
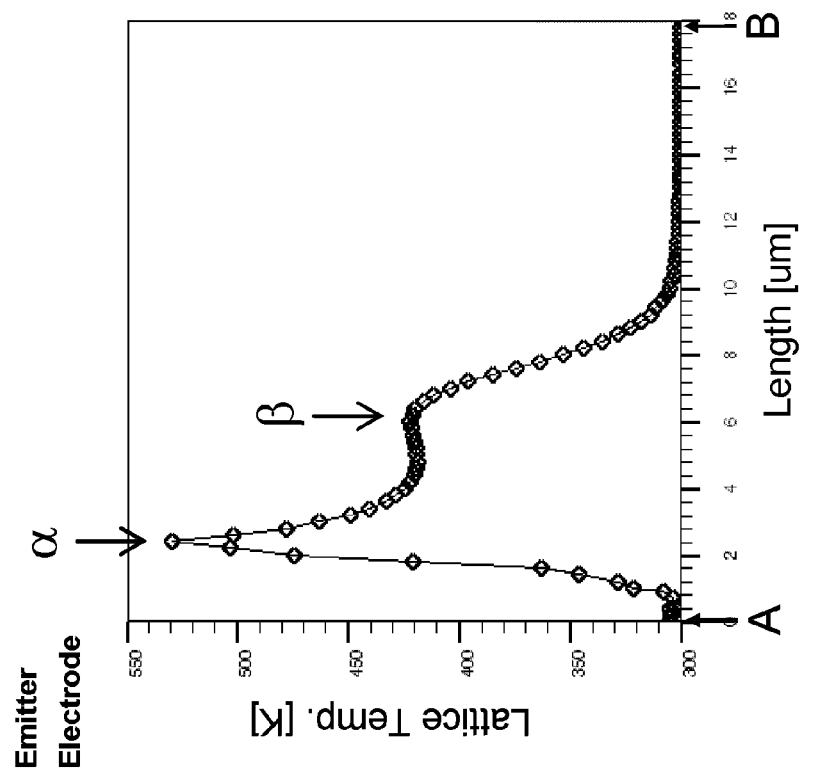
FIG. 13B is a lattice temperature distribution along a line segment AB of FIG. 13A.
Figure 13A:
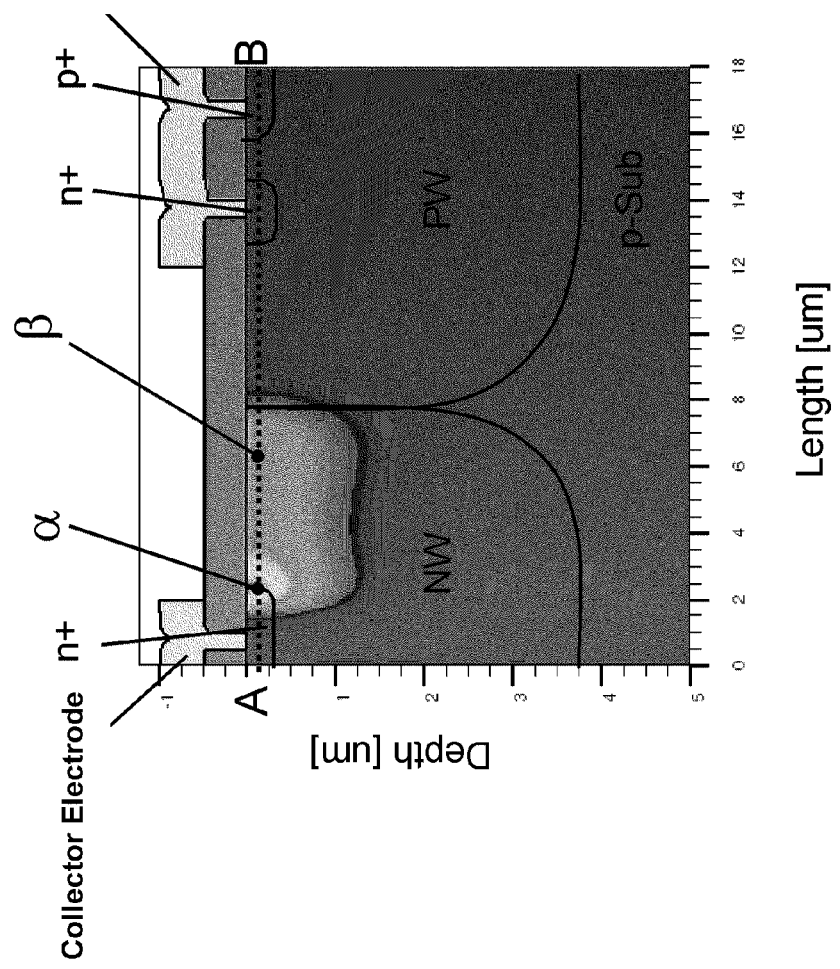
FIG. 13A is a simulated lattice temperature distribution of the ESD element illustrated in FIG. 2.

FIG. 12A is an example of an impurity concentration distribution of a section of the ESD element of the related art (corresponding to FIG. 2), and FIG. 12B is an impurity concentration distribution along a line segment AB of FIG. 12A. The static electricity injected from the collector electrode has a tendency to flow to an emitter direction. However, when there is a high resistance portion along the way, the electric charges accumulate there to generate a high electric field. There are two such portions a and 13 as illustrated in FIG. 12B. FIGS. 13A and 13B illustrate simulation results of lattice temperature when an electrostatic current pulse of 5 mA is injected to the collector electrode of this structure, of which FIG. 13A is a lattice temperature distribution of a section, and FIG. 13B is a lattice temperature distribution along a line segment AB of FIG. 13A. As may be seen from FIGS. 13A and 13B, the lattice temperature increases at portions α and β illustrated in FIGS. 12A and 12B, and the maximum lattice temperature reaches to 530 K at the portion α.

Figure 14A:
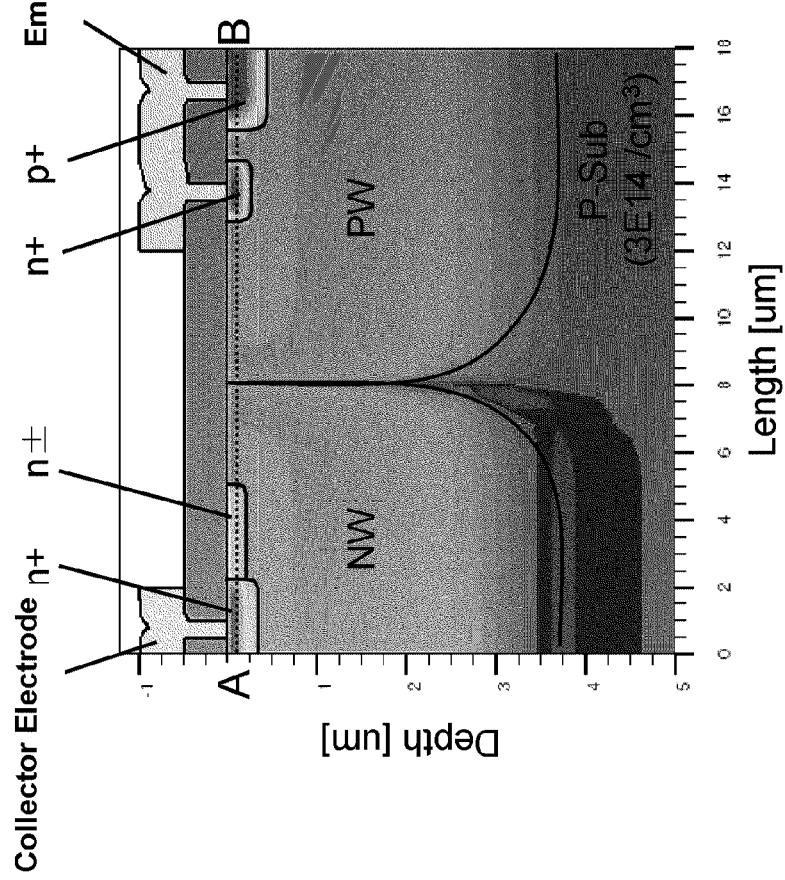
FIG. 14A is a simulated impurity concentration distribution of the ESD element according to Embodiment 1 of the present invention.
Figure 14B:
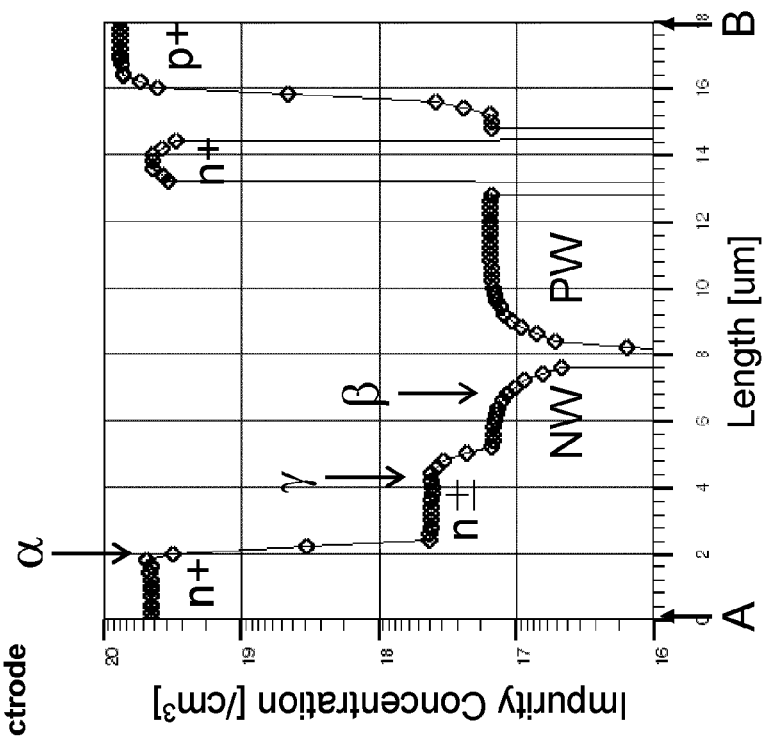
FIG. 14B is an impurity concentration distribution along a line segment AB of FIG. 14A.
Figure 15B:
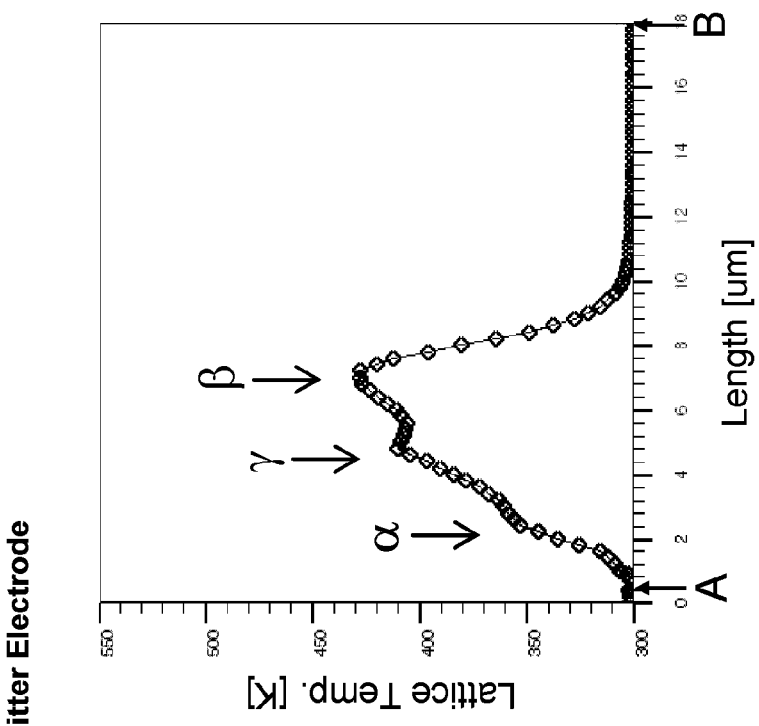
FIG. 15B is a lattice temperature distribution along a line segment AB of FIG. 14A.
Figure 15A:
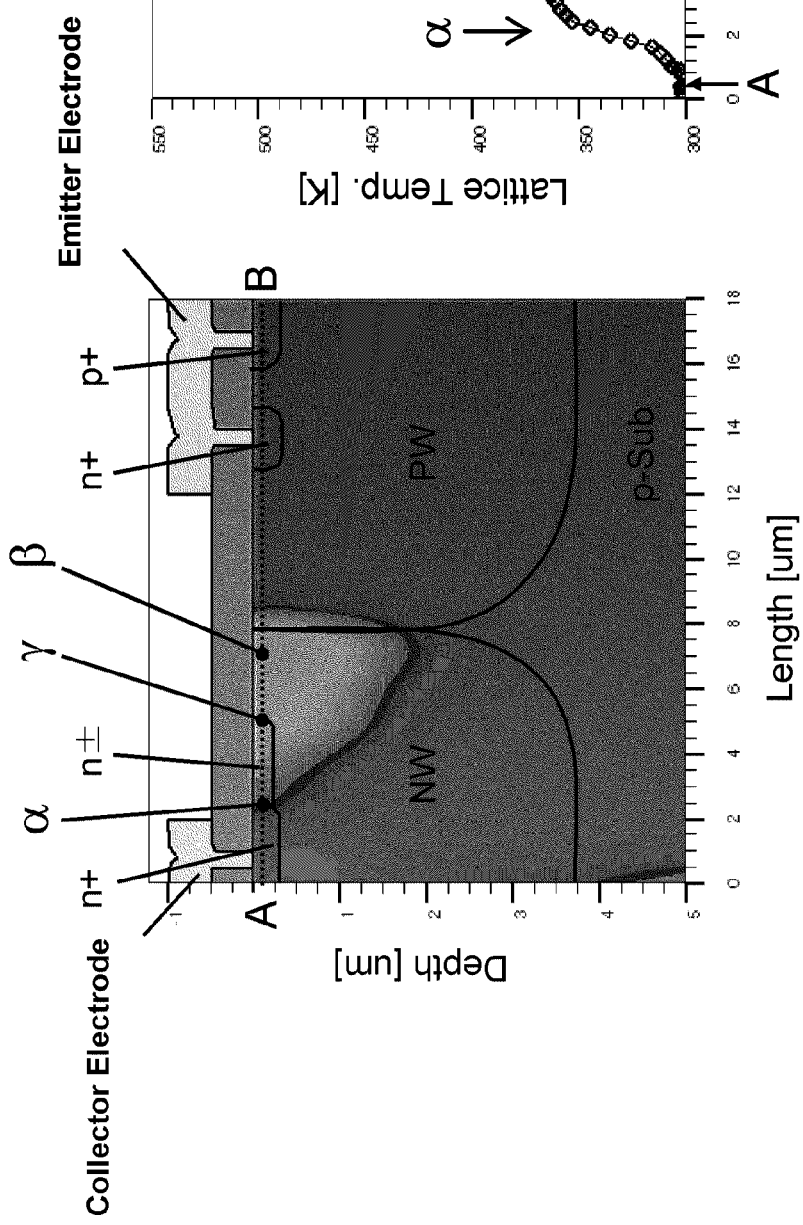
FIG. 15A is a simulated lattice temperature distribution of the ESD element according to Embodiment 1 of the present invention.

In contrast, FIGS. 14A and 14B illustrate examples of concentration distribution when the structure according to Embodiment 1 illustrated in FIG. 1 is employed. With this structure, electric charges accumulate to generate high electric fields at three portions in total, that is, α and β of FIG. 12 as well as γ. FIGS. 15A and 15B illustrate simulation results of lattice temperature when an electrostatic current pulse of 5 mA is injected to the collector electrode of this structure in the same manner. The lattice temperature increases at portions α, β, and γ illustrated in FIGS. 14A and 14B, but the maximum lattice temperature reaches not more than 430 K at the portion β. This shows that the maximum heat generation temperature is suppressed compared to the related art. This is because inserting the n± layer, which is the electric field relaxation layer for suppressing heat generation, makes the concentration gradient milder at the portion α, distributes the remaining concentration gradient to the portion γ, disperses the heat generation areas, and hence suppresses the maximum heat generation temperature. Accordingly, the heat generation temperature at the portion α is suppressed compared to the related art, and a distance b illustrated in FIG. 1 may be reduced.

Embodiment 2

Figure 3:
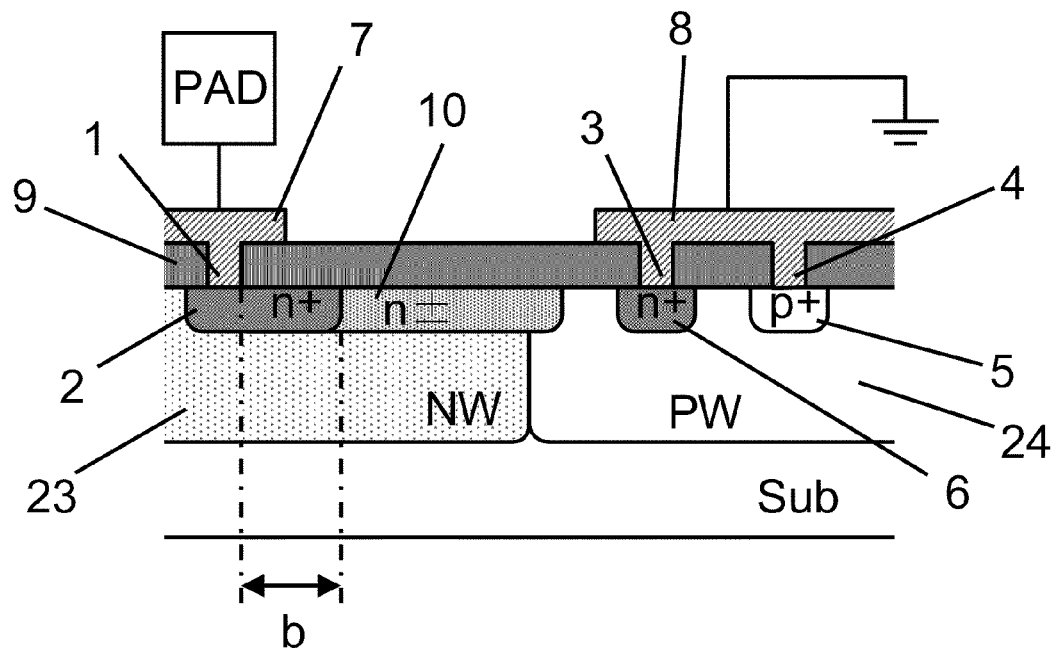
FIG. 3 is a sectional view illustrating Embodiment 2 of the present invention.
Figure 16B:
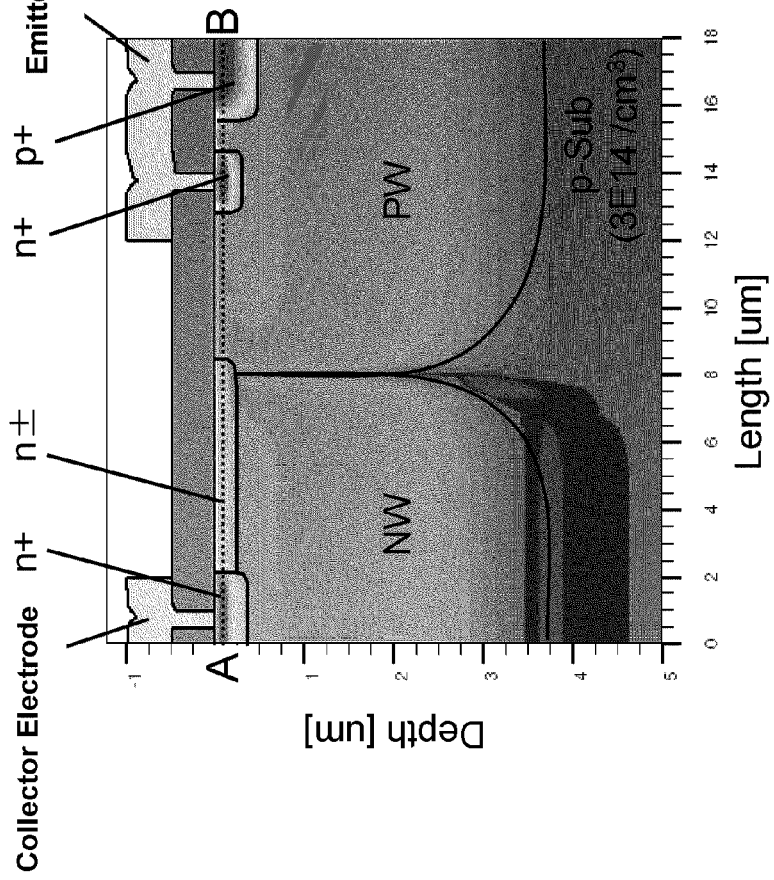
FIG. 16B is an impurity concentration distribution along a line segment AB of FIG. 16A.
Figure 16A:
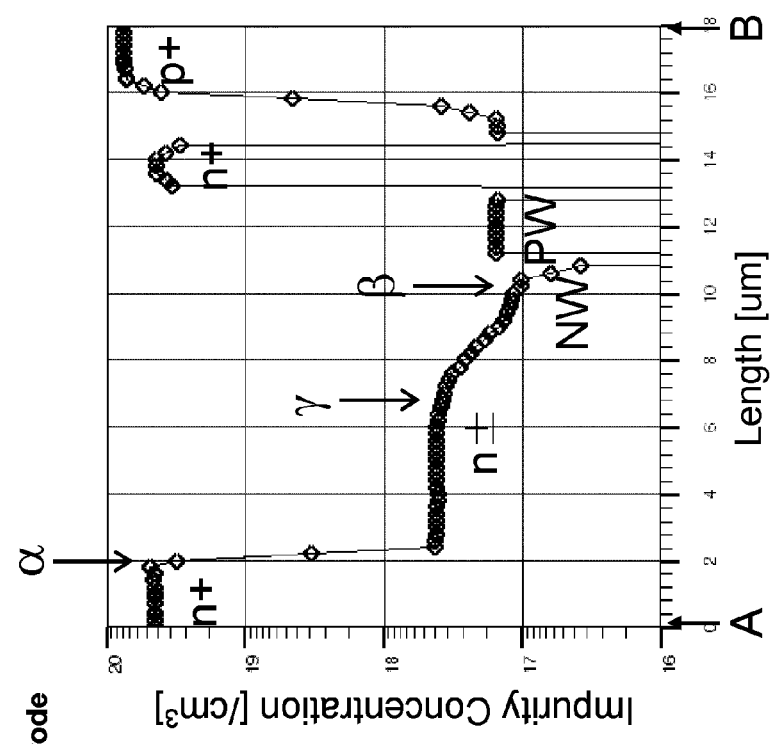
FIG. 16A is a simulated impurity concentration distribution of the ESD element according to Embodiment 2 of the present invention.
Figure 17A:
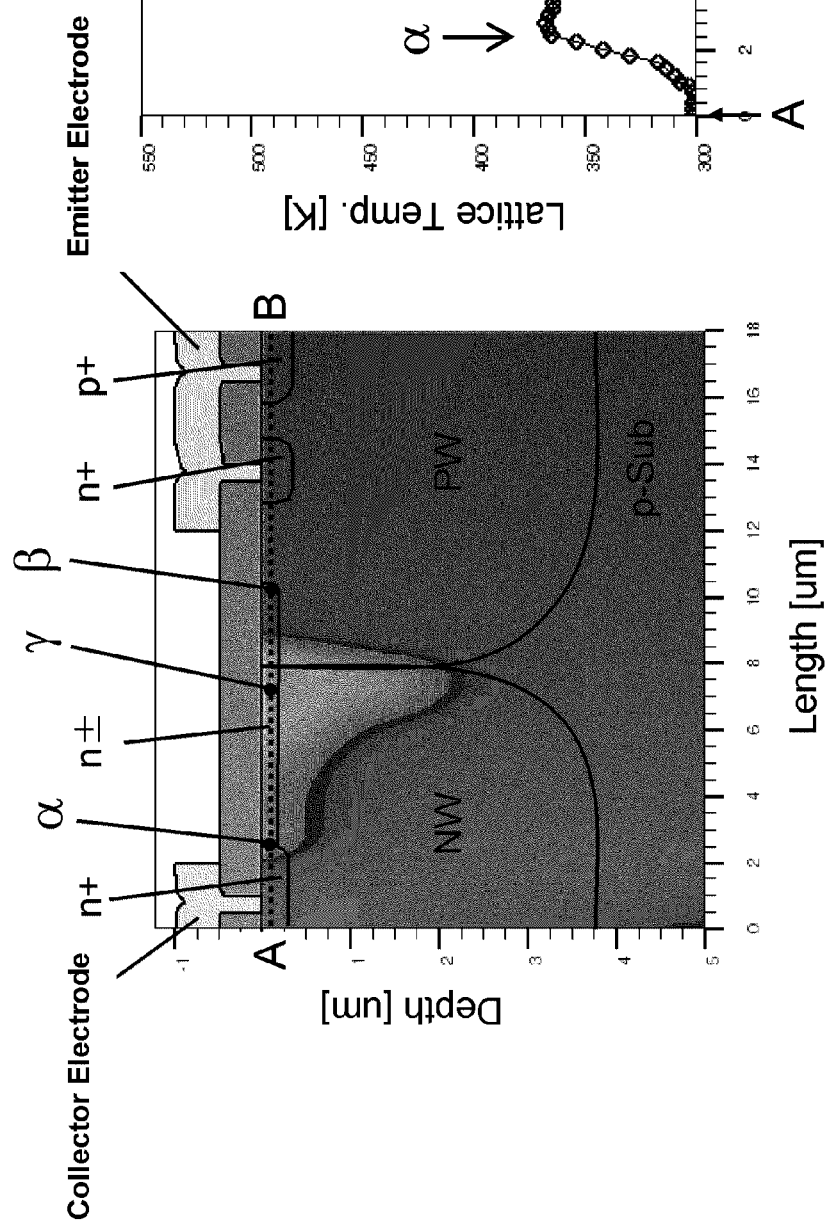
FIG. 17A is a simulated lattice temperature distribution of the ESD element according to Embodiment 2 of the present invention.
Figure 17B:
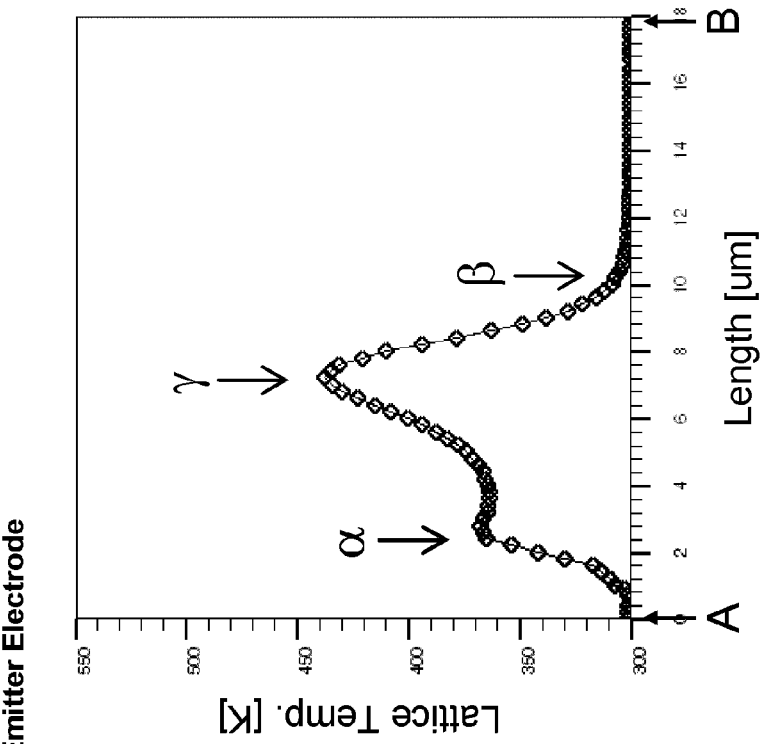
FIG. 17B is a lattice temperature distribution along a line segment AB of FIG. 17A.

FIG. 3 is a sectional view illustrating Embodiment 2 of the present invention. Embodiment 2 adopts a structure in which the n+ layer 10 of Embodiment 1 illustrated in FIG. 1 is extended to the PW layer 24. FIGS. 16A, 16B, 17A, and 17B illustrate simulation results of this structure as in Embodiment 1, of which FIGS. 16A and 16B illustrate impurity concentration distributions and FIGS. 17A and 17B illustrate lattice temperature distributions. The concentration distribution of FIG. 16B shows that there are three portions α, β, and γ where electric charges accumulate to generate high electric fields, and peak points of the lattice temperature of FIG. 17B correspond to positions α, β, and γ of FIG. 16B. Note here that the heat generated at the portion β is small in amount and most of the amount of generated heat is distributed between the portions α and γ. This situation may seem similar to the case of the related art, but the amount of generated heat is distributed in a balanced manner between the portions α and γ in Embodiment 2 of the present invention. Accordingly, the maximum amount of the heat generated at the portion γ is 440 K, which is reduced compared to the related art. Consequently, this structure may attain the effects similar to Embodiment 1 and suppress the temperature of the heat generated at the portion α compared to the related art, to thereby enable the distance b to be reduced.

Note here that with this structure, the concentration gradient changes on the NW side of the junction portion between the PW layer and the NW layer to change the breakdown voltage of the ESD element, and hence careful consideration needs to be given thereto. On the other hand, when considered from a different angle, this structure enables the withstanding voltage to be finely adjusted by changing the extension amount of the n± electric field relaxation layer for suppressing heat generation into the PW base region.

Embodiment 3

Figure 4:
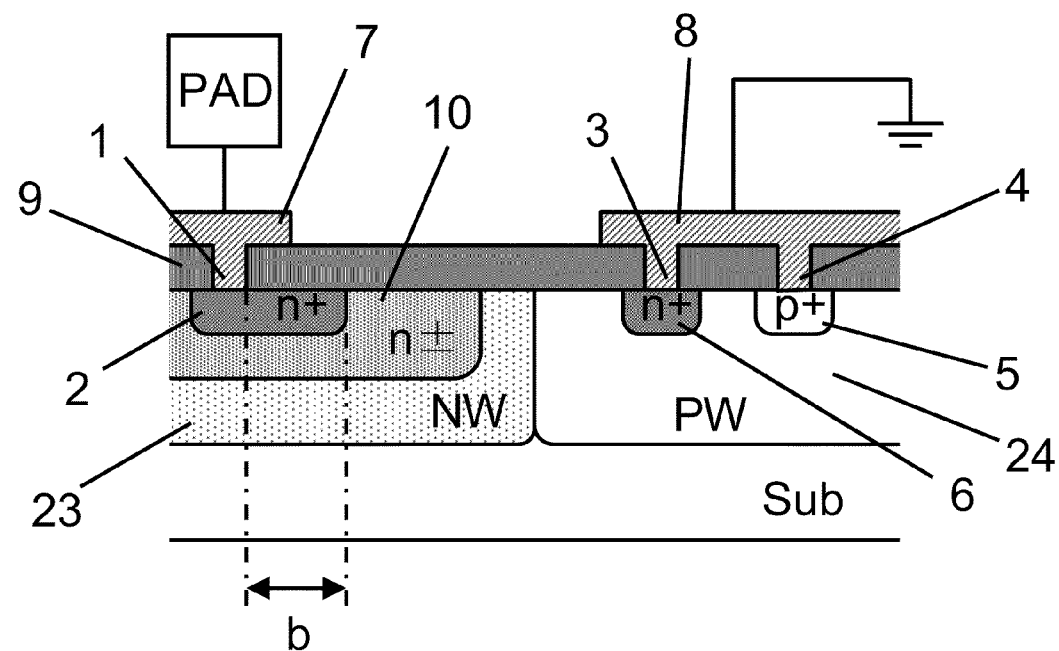
FIG. 4 is a sectional view illustrating Embodiment 3 of the present invention.

FIG. 4 is a sectional view illustrating Embodiment 3 of the present invention. Embodiment 3 is different from Embodiment 1 illustrated in FIG. 1 in that the n± layer 10 is formed by double diffusion. Specifically, the n± layer 10 is formed to surround a bottom surface and side surfaces of the n+ collector layer 2. This structure also attains an ESD immunity effect equivalent to Embodiment 1 of the present invention.

Embodiment 4

Figure 5:
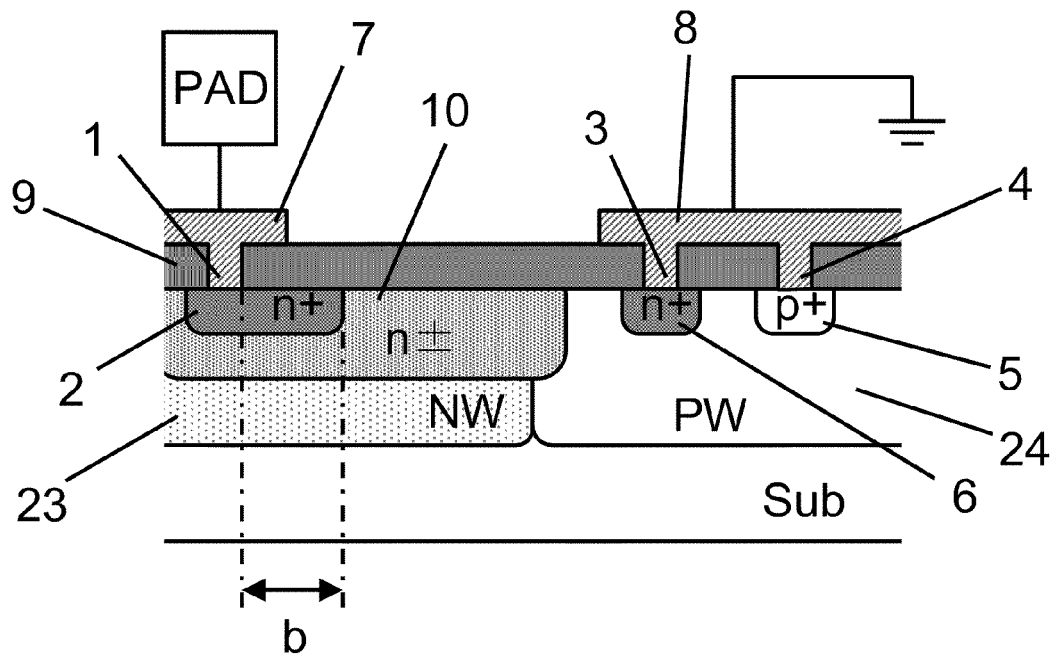
FIG. 5 is a sectional view illustrating Embodiment 4 of the present invention.

FIG. 5 is a sectional view illustrating Embodiment 4 of the present invention. Embodiment 4 is different from Embodiment 2 illustrated in FIG. 3 in that the n± layer 10 is formed by double diffusion. Specifically, the n± layer 10 is formed to surround the bottom surface and the side surfaces of the n+ collector layer 2. This structure also attains the ESD immunity effect equivalent to Embodiment 2 of the present invention.

Embodiment 5

Figure 6:
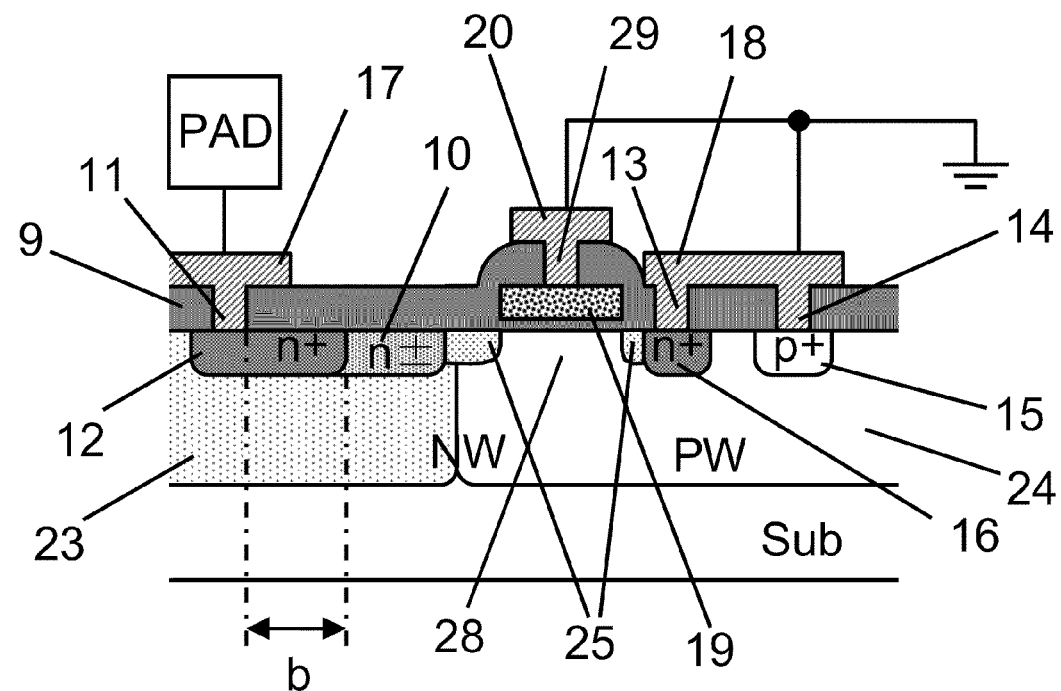
FIG. 6 is a sectional view illustrating Embodiment 5 of the present invention.

Each of the ESD elements according to Embodiments 1 to 4 of the present invention is an ESD element having a structure of a bipolar transistor, but the present invention is also applicable to an ESD element having a structure of a metal oxide semiconductor (MOS) transistor. As an example, FIG. 6 illustrates a case where the fundamental structure of Embodiment 1 is applied to an ESD element having a general structure of a lightly doped drain (LDD) MOS transistor. At a surface of a semiconductor substrate Sub, an NW layer 23 (n-type well in this embodiment), which is an electric field relaxation layer for improving withstanding voltage having an impurity concentration higher than that of the semiconductor substrate, and a PW layer 24 (p-type well in this embodiment), which is a region of an opposite conductivity type to the NW layer, are formed adjacent to each other. At the surface of the semiconductor substrate in the NW layer 23, an n+ drain layer 12, which is a high concentration region, is formed, and an n± layer 10, which is an electric field relaxation layer for suppressing heat generation and is an intermediate concentration region, is formed adjacent to the n+ drain layer 12 on a side of the n+ drain layer 12 which is nearer to the PW layer 24. At this time, one side end of the n± layer 10 is adjacent to the n+ drain layer 12, and the other side end is in contact with a first n− region 25, which is a low concentration region. The first n− region 25 extends across the junction interface between the NW layer 23 and the PW layer 24 into the PW layer 24, and the other end of the first n− region 25 is in contact with a channel region 28, which has the same concentration as the PW layer 24. Further, at the surface of the semiconductor substrate in the PW layer 24, a second n− region 25, an n+ source layer 16, and a p+ voltage fixation layer 15 are formed. The second n− region 25 is formed to be in contact with the above-mentioned channel region 28, and the n+ source layer 16 is further formed to be in contact with the second n− region 25. Further, the p+ voltage fixation layer 15 is formed to be separated from the n+ source layer 16. Above the channel region 28 sandwiched between the first n− region 25 and the second n− region 25, a gate electrode 19 formed of polycrystalline silicon is formed through an insulating film 9.

A drain contact region 11, a gate contact region 29, a source contact region 13, and a substrate contact region 14 are formed on the n+ drain layer 12, the gate electrode 19, the n+ source layer 16, and the p+ voltage fixation layer 15 to extract electrodes, respectively. The n+ drain layer 12 is connected to an input pad (PAD) through a drain electrode 17. The n+ source layer 16 and the p+ voltage fixation layer 15 are connected to ground through a source/substrate electrode 18 serving as a common wiring. Further, the gate electrode 19 is also configured to have the same potential by being connected to the source/substrate electrode 18 through a gate wiring 20 formed of a metal.

With the above-mentioned MOS structure, a potential of the channel region 28 may be suppressed by the gate electrode and hence a leak current may be reduced compared to the structure of the bipolar transistor. Accordingly, a channel length may be reduced and hence the size may be reduced. The ESD immunity effect is equivalent to Embodiment 1 of the present invention.

In this embodiment, the example of the MOS transistor having the LDD structure has been described, but it should be understood that the similar effect may be obtained when a MOS transistor having a conventional structure, which does not have an n− region as a low concentration region.

Embodiment 6

In a case where a salicide process is used in manufacturing the semiconductor device, when static electricity is injected to a drain portion of a MOS transistor produced by the salicide process, the static electricity reaches a gate edge through a surface of a silicided substrate with reduced resistance to destroy a gate insulating film, causing a significant lowering of the ESD immunity. Thus, a salicide block process is generally added to the salicide process to avoid the reduction of the ESD immunity.

Figure 7:
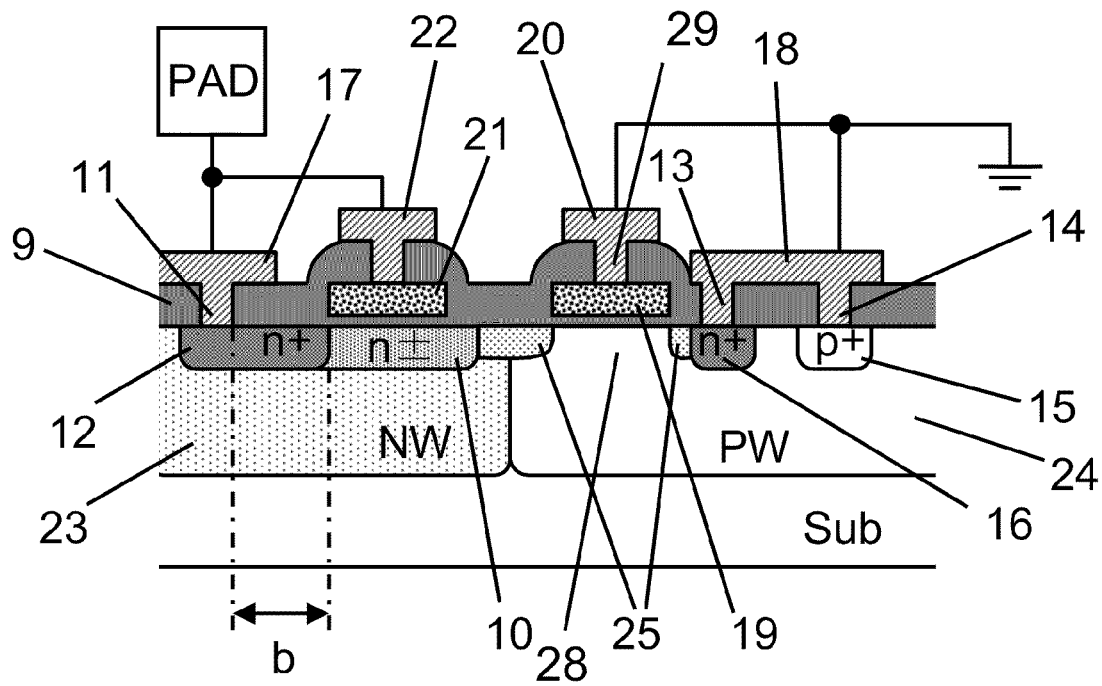
FIG. 7 is a sectional view illustrating Embodiment 6 of the present invention.

FIG. 7 is a sectional view illustrating Embodiment 6 of the present invention. Embodiment 6 adopts a structure in which an electrode for blocking salicide 21 is formed above the surface of the substrate between the n+ drain layer 12 and the gate electrode 19 of Embodiment 5. In the salicide process, forming the electrode for blocking salicide 21 may prevent the surface of the substrate immediately below the electrode for blocking salicide 21 from being silicided and hence the ESD immunity from being reduced, to thereby obtain an ESD immunity effect equivalent to the salicide block process. For example, when the electrode for blocking salicide 21 is formed of the same material as the gate electrode 19, the existing process may be used to block salicide without adding the salicide block process to thereby reduce the number of process steps.

In this case, a floating potential should be avoided in order to stabilize the property of the electrode for blocking salicide 21. Further, when the electrode for blocking salicide 21 has the same potential as the source/substrate electrode 18, destruction may occur between the n+ drain layer 12 and the electrode for blocking salicide 21. Further, when positive static electricity is injected to the PAD, the n+ layer 10 may be depleted to significantly compromise the driving ability of the protection element. Accordingly, the potential of the electrode for blocking salicide 21 is set desirably the same as a potential of the drain electrode 17 through an electrode wiring for blocking salicide 22.

With this structure, even when the salicide process is used, an ESD immunity effect equivalent to Embodiment 5 of the present invention may be obtained without adding the salicide block process.

Embodiment 7

Figure 8:
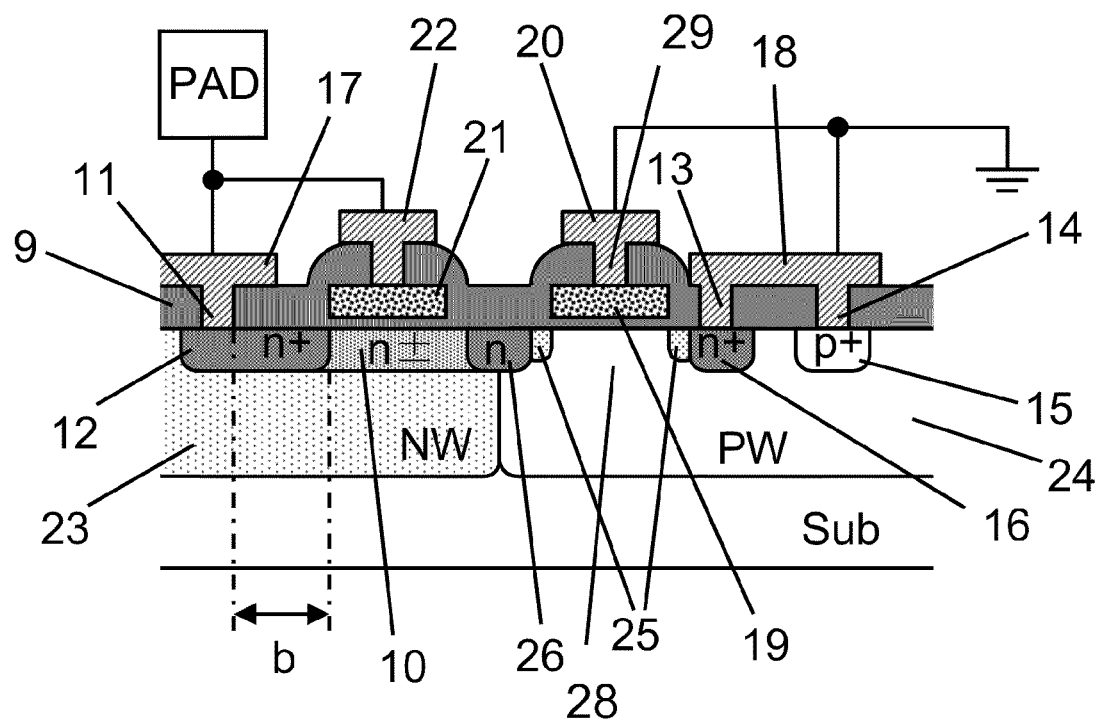
FIG. 8 is a sectional view illustrating Embodiment 7 of the present invention.

FIG. 8 is a sectional view illustrating Embodiment 7 of the present invention. Embodiment 7 adopts a structure in which an n-type withstanding voltage adjusting layer 26 is formed at the surface of the substrate between the electrode for blocking salicide 21 and the gate electrode 19 of Embodiment 6. Specifically, Embodiment 7 is different from Embodiment 6 in that the n-type withstanding voltage adjusting layer 26 is formed between the n+ layer 10 and the first n− region 25. It is possible to adjust the withstanding voltage of the protection element by adjusting an impurity concentration of the withstanding voltage adjusting layer 26. An ESD immunity effect is equivalent to Embodiment 6 of the present invention.

Figure 18:
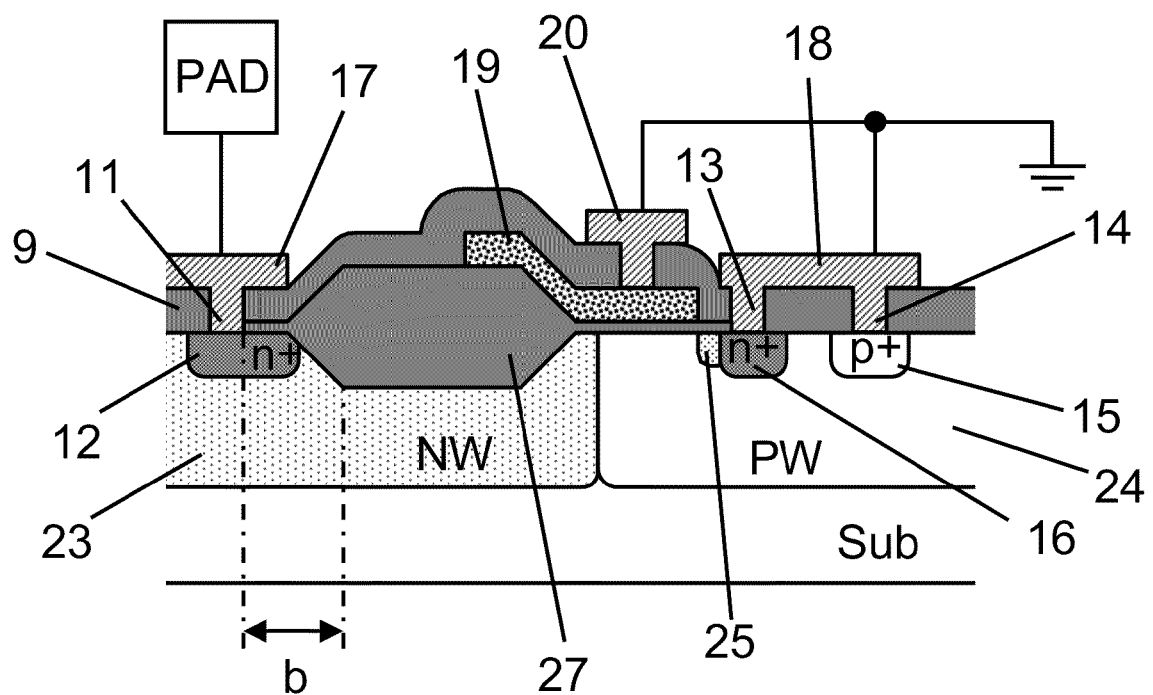
FIG. 18 is a sectional view illustrating a MOS type ESD element having an extended drain structure according to a related art.
Figure 19B:
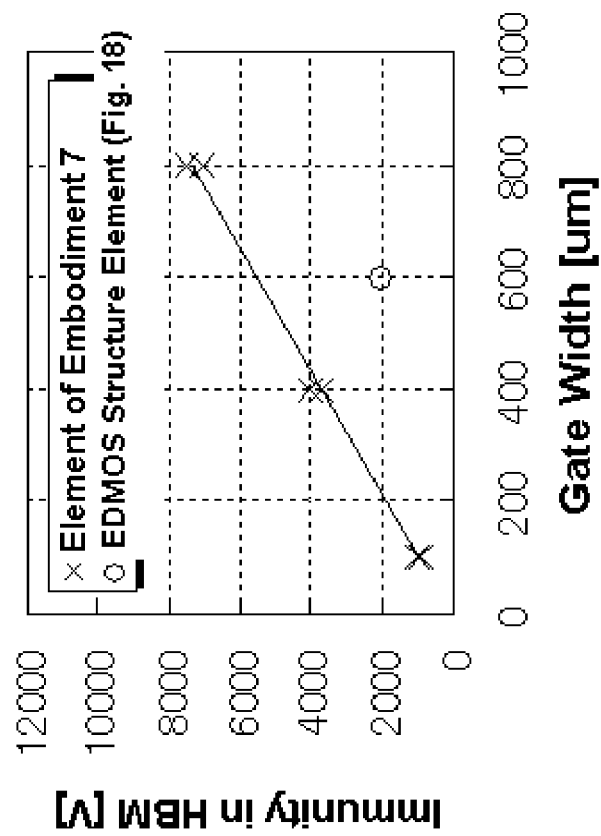
FIG. 19B is an ESD test result for gate width dependency according to a machine model.
Figure 19A:
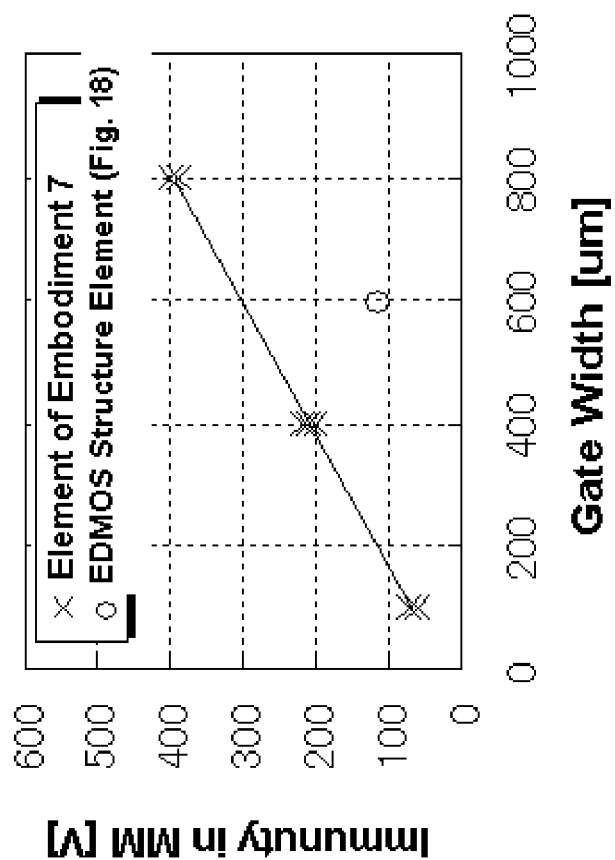
FIG. 19A is an ESD test result for gate width dependency according to a human body model.

FIGS. 19A and 19B illustrate actual results of ESD tests, of which FIG. 19A illustrates a result of a human body model (HBM) test, and FIG. 19B illustrates a result of a machine model (MM) test. In each of the figures, an ordinate represents ESD immunity in voltage, and an abscissa represents gate width. Circles (○) represent results of an ESD element having a general extended drain MOS (EDMOS) structure, which does not adopt the present invention, and crosses (×) represent results of a case where the structure according to Embodiment 7 of the present invention is adopted. FIG. 18 illustrates a sectional structure of the ESD element having the EDMOS structure described above. The EDMOS structure has a distance b of 0.24 μm, which is substantially the same as the distance b of 0.20 μm of the structure of Embodiment 7. When the results are compared at the same gate width of 600 μm (the results of the structure of Embodiment 7 does not include the measurement value at 600 µm, and hence the value is predicted by linear interpolation), the ESD element of Embodiment 7 is improved in ESD immunity by approximately three times with respect to the EDMOS structure in both the HBM and the MM. This result demonstrates the heat generation suppressing effect of the present invention.

Figure 20B:
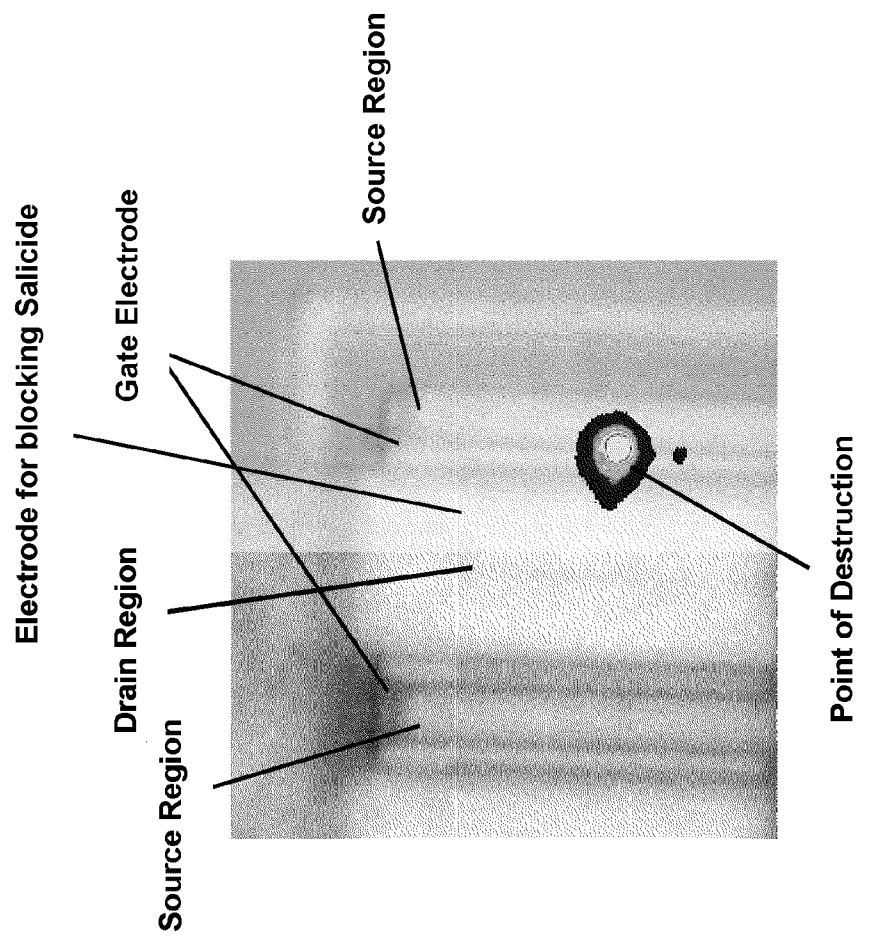
FIGS. 20A and 20B are views illustrating points of destruction of ESD elements after the ESD tests.
Figure 20A:
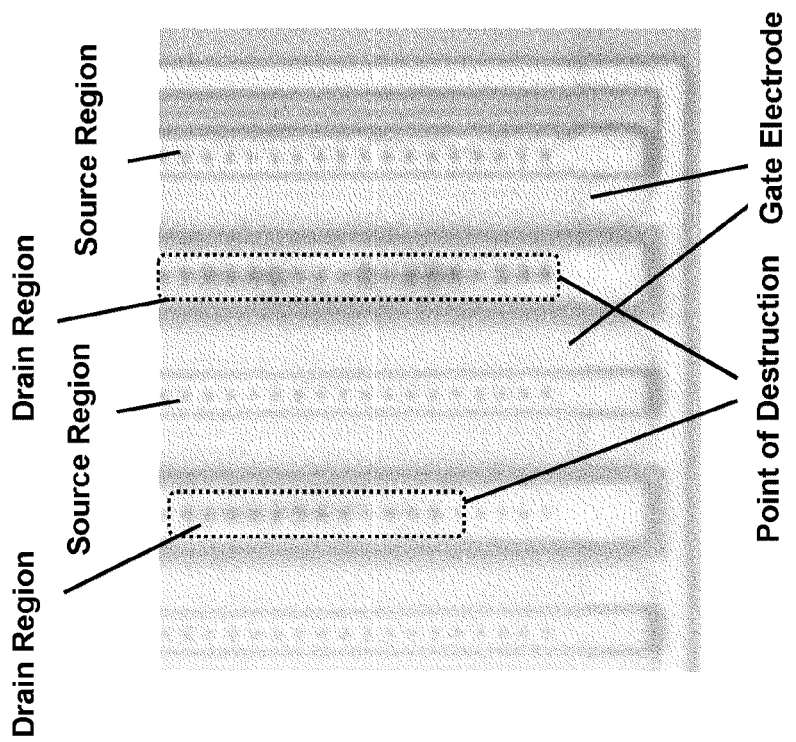

Further, FIGS. 20A and 20B are pictures of points of destruction of samples destroyed in FIGS. 19A and 19B, of which part (a) illustrates the ESD element having the EDMOS structure, and part (b) illustrates the ESD element having the structure of Embodiment 7. In the ESD element having the EDMOS structure that does not embody the present invention, the contact portion of the drain region is destroyed. This is conceivably because heat is locally generated at the portion α, which is a maximum heat generation temperature area of FIGS. 12A, 12B, 13A, and 13B, and the heat is conducted to the drain contact portion to melt and destroy the drain electrode. This shows that the obtained result is consistent with the simulation. On the other hand, in the ESD element according to Embodiment 7 embodying the present invention, the point of destruction is not in the drain region but in the gate electrode edge portion. This point of destruction corresponds to the portion β, which is a maximum heat generation temperature area of FIGS. 14A, 14B, 15A, and 15B. This also shows that the obtained result is consistent with the simulation.

Embodiment 8

Figure 9:
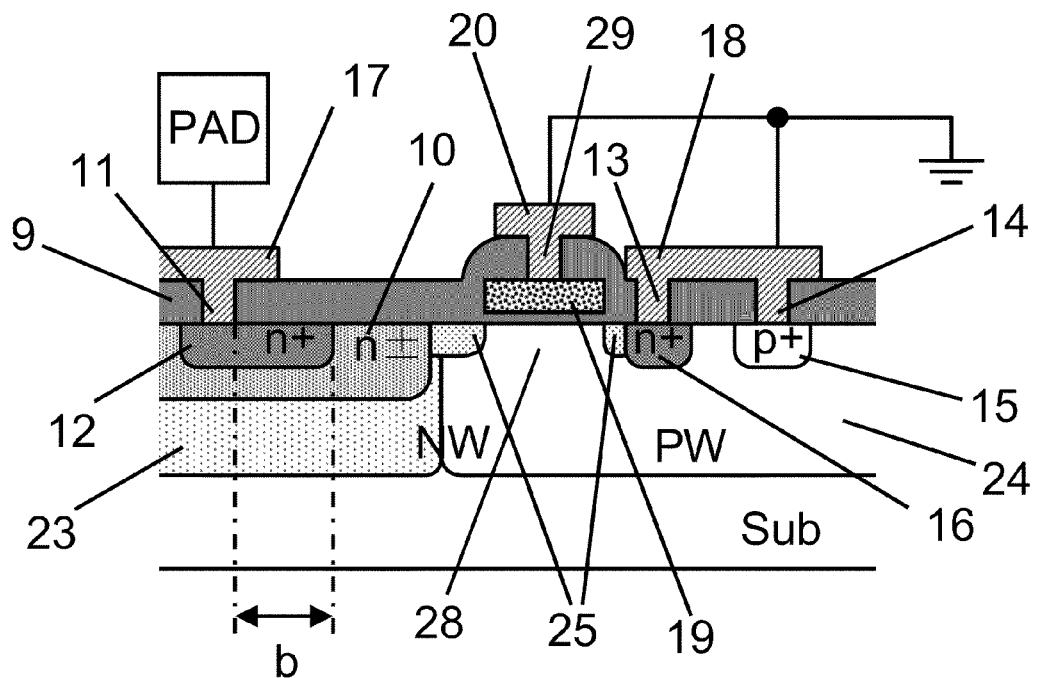
FIG. 9 is a sectional view illustrating Embodiment 8 of the present invention.

FIG. 9 is a sectional view illustrating Embodiment 8 of the present invention. The n± layer 10, which is the electric field relaxation layer for suppressing heat generation of Embodiment 5, is formed by double diffusion in this embodiment. Specifically, the n± layer 10 is formed to surround a bottom surface and side surfaces of the n+ drain layer 12. This structure also attains the ESD immunity effect equivalent to Embodiment 5 of the present invention.

Embodiment 9

Figure 10:
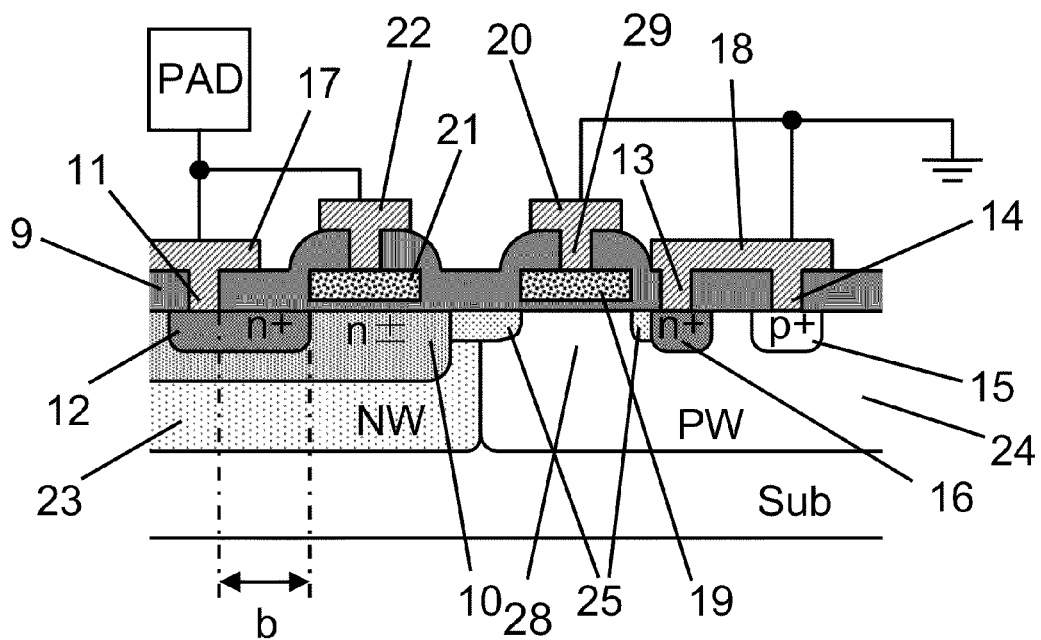
FIG. 10 is a sectional view illustrating Embodiment 9 of the present invention.

FIG. 10 is a sectional view-illustrating Embodiment 9 of the present invention. The n± layer 10 of Embodiment 6 is formed by double diffusion in this embodiment. Specifically, the n± layer 10 is formed to surround the bottom surface and the side surfaces of the n+ drain layer 12. This structure also attains the ESD immunity effect equivalent to Embodiment 6 of the present invention.

Embodiment 10

Figure 11:
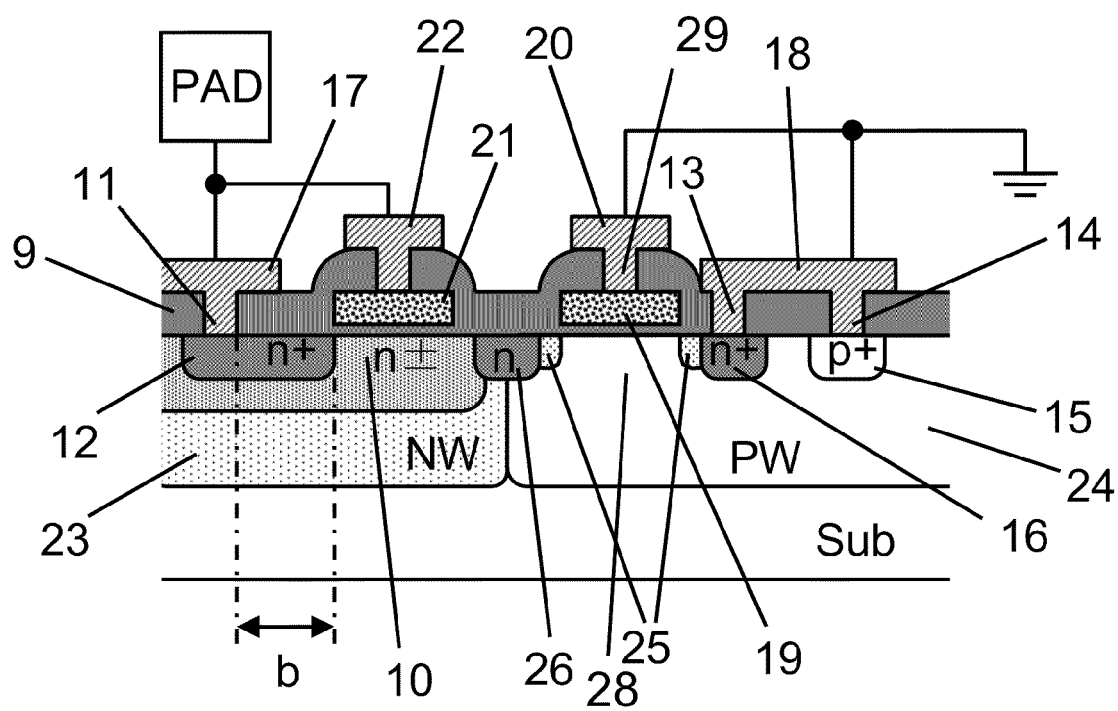
FIG. 11 is a sectional view illustrating Embodiment 10 of the present invention.

FIG. 11 is a sectional view-illustrating Embodiment 10 of the present invention. The n± layer 10 of Embodiment 7 is formed by double diffusion in this embodiment. Specifically, the n± layer 10 is formed to surround the bottom surface and the side surfaces of the n+ drain layer 12. This structure also attains the ESD immunity effect equivalent to Embodiment 7 of the present invention.

Note that the present invention is not limited to the embodiments described above, and modifications may be made thereto without departing from the spirit of the invention.

What is claimed is:

1. A semiconductor device, comprising:
a semiconductor substrate;
a first layer of a first conductivity type at a surface of the semiconductor substrate and having an impurity concentration higher than an impurity concentration of the semiconductor substrate;
a second layer of a second conductivity type at the surface of the semiconductor substrate to be in contact with the first layer and having an impurity concentration higher than the impurity concentration of the semiconductor substrate;
a voltage fixation layer of a first conductivity type at the surface of the semiconductor substrate in the first layer and having an impurity concentration higher than the impurity concentration of the first layer;
a drain layer of a second conductivity type at the surface of the semiconductor substrate in the second layer and having an impurity concentration higher than the impurity concentration of the second layer;
a source layer of a second conductivity type located between and spaced apart from the voltage fixation layer and the drain layer at the surface of the semiconductor substrate in the first layer, and having an impurity concentration higher than the impurity concentration of the first layer;
an electric field relaxation layer of a second conductivity type between the drain layer and the first layer in contact with the drain layer and having an impurity concentration lower than the impurity concentration of the drain layer and higher than the impurity concentration of the second layer;
a withstanding voltage adjusting layer of the second conductivity type at the surface of the semiconductor substrate between the electric field relaxation layer and source layer;
a gate oxide film formed on the surface of the semiconductor substrate in a portion between the electric field relaxation layer and the source layer; and
a gate electrode formed on the gate oxide film.

2. A semiconductor device according to claim 1, further comprising:
an oxide film formed on the surface of the semiconductor substrate in a portion of the electric field relaxation layer; and
an electrode formed on the oxide film to be separated from the gate electrode.

3. A semiconductor device according to claim 2, wherein the withstanding voltage adjusting layer resides between the gate electrode and the electrode above the electric field relaxation layer.

4. A semiconductor device according to claim 3, wherein the electric field relaxation layer is formed inside the second layer.

5. A semiconductor device according to claim 3, wherein the drain layer is formed inside the electric field relaxation layer.

6. A semiconductor device according to claim 2, wherein the electric field relaxation layer is formed inside the second layer.

7. A semiconductor device according to claim 2, wherein the drain layer is formed inside the electric field relaxation layer.

8. A semiconductor device according to claim 1, wherein the electric field relaxation layer is formed inside the second layer.

9. A semiconductor device according to claim 1, wherein the drain layer is formed inside the electric field relaxation layer.

* * * * *